(12) United States Patent
Liang et al.

(10) Patent No.: US 7,528,028 B2
(45) Date of Patent: May 5, 2009

(54) SUPER ANNEAL FOR PROCESS INDUCED STRAIN MODULATION

(75) Inventors: Mong Song Liang, Hsin-Chu (TW); Chien-Hao Chen, Chuangwei Township (TW); Chun-Feng Nieh, Baoshan Township (TW); Pang-Yen Tsai, Jhu-bei (TW); Tze-Liang Lee, Hsinchu (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 360 days.

(21) Appl. No.: 11/199,011

(22) Filed: Aug. 8, 2005

(65) Prior Publication Data

US 2006/0286758 A1 Dec. 21, 2006

Related U.S. Application Data

(60) Provisional application No. 60/691,422, filed on Jun. 17, 2005.

(51) Int. Cl.
*H01L 21/8238* (2006.01)
(52) U.S. Cl. ............... 438/199; 438/197; 257/E21.7
(58) Field of Classification Search ........... 438/154, 438/197, 199, 201, 305, 184; 257/E21.7
See application file for complete search history.

(56) References Cited

U.S. PATENT DOCUMENTS

| | | | |
|---|---|---|---|
| 4,593,306 A * | 6/1986 | Marchant et al. ......... 257/617 |
| 4,690,730 A * | 9/1987 | Tang et al. ............ 438/649 |
| 5,066,610 A | 11/1991 | Chen et al. |
| 5,298,441 A | 3/1994 | Goronkin et al. |
| 5,561,302 A | 10/1996 | Candelaria |
| 5,562,770 A | 10/1996 | Chen et al. |
| 5,610,088 A | 3/1997 | Chang et al. |
| 5,668,387 A | 9/1997 | Streit et al. |
| 5,834,363 A | 11/1998 | Masanori |
| 6,271,054 B1 | 8/2001 | Ballantine et al. |
| 6,281,532 B1 | 8/2001 | Doyle et al. |
| 6,284,610 B1 | 9/2001 | Cha et al. |

(Continued)

OTHER PUBLICATIONS

Chen, C.-H., et al., "Stress Memorization Technique (SMT) by Selectively Strained-Nitride Capping for Sub-65 nm High-Performance Strained-Si Device Application," 2004 Symposium on VLSI Technology Digest of Technical Papers, IEEE, pp. 56-57.

(Continued)

*Primary Examiner*—Walter L Lindsay, Jr.
(74) *Attorney, Agent, or Firm*—Slater & Matsil, L.L.P.

(57) ABSTRACT

A method for forming a semiconductor structure includes providing a substrate, forming a first device region on the substrate, forming a stressor layer overlying the first device region, and super annealing the stressor layer in the first device region, preferably by exposing the substrate to a high-energy radiance source, so that the stressor layer is super annealed for a substantially short duration. Preferably, the method further includes masking a second device region on the substrate while the first device region is super annealed. Alternatively, after the stressor layer in the first region is annealed, the stressor layer in the second device region is super annealed. A semiconductor structure formed using the method has different strains in the first and second device regions.

18 Claims, 6 Drawing Sheets

U.S. PATENT DOCUMENTS

| | | |
|---|---|---|
| 6,335,249 B1 | 1/2002 | Thei et al. |
| 6,348,389 B1 | 2/2002 | Chou et al. |
| 6,403,482 B1 | 6/2002 | Rovedo et al. |
| 6,444,566 B1 | 9/2002 | Tsai et al. |
| 6,492,216 B1 | 12/2002 | Yeo et al. |
| 6,555,839 B2 | 4/2003 | Fitzgerald |
| 6,573,172 B1 | 6/2003 | En et al. |
| 6,599,792 B2 | 7/2003 | Jung |
| 6,624,489 B2 | 9/2003 | Chong et al. |
| 6,638,838 B1 | 10/2003 | Eisenbeiser et al. |
| 6,645,853 B1 * | 11/2003 | Ngo et al. .................... 438/637 |
| 6,678,307 B2 | 1/2004 | Ezaki et al. |
| 6,706,576 B1 * | 3/2004 | Ngo et al. .................... 438/197 |
| 6,737,308 B2 | 5/2004 | Kim |
| 6,841,430 B2 | 1/2005 | Sugawara et al. |
| 6,855,982 B1 | 2/2005 | Xiang et al. |
| 6,890,808 B2 | 5/2005 | Chidambarrao et al. |
| 6,930,007 B2 | 8/2005 | Bu et al. |
| 6,982,181 B2 | 1/2006 | Hideo |
| 7,002,209 B2 * | 2/2006 | Chen et al. ................... 257/336 |
| 7,119,404 B2 * | 10/2006 | Chang et al. .................. 257/389 |
| 7,129,127 B2 | 10/2006 | Chidambaram et al. |
| 7,265,009 B2 * | 9/2007 | Chen ........................ 438/199 |
| 2002/0008289 A1 | 1/2002 | Murota et al. |
| 2002/0009842 A1 * | 1/2002 | Tung ........................ 438/199 |
| 2002/0011603 A1 | 1/2002 | Yagishita et al. |
| 2002/0058186 A1 | 5/2002 | Nozawa et al. |
| 2002/0125497 A1 | 9/2002 | Fitzgerald |
| 2002/0175146 A1 | 11/2002 | Dokumaci et al. |
| 2002/0192914 A1 | 12/2002 | Kizilyalli et al. |
| 2004/0075148 A1 | 4/2004 | Kumagai et al. |
| 2004/0097030 A1 | 5/2004 | Sayama et al. |
| 2004/0099910 A1 | 5/2004 | Choe et al. |
| 2004/0110377 A1 | 6/2004 | Cho et al. |
| 2004/0115888 A1 | 6/2004 | Chang |
| 2004/0173812 A1 | 9/2004 | Currie et al. |
| 2004/0212035 A1 | 10/2004 | Yeo et al. |
| 2004/0266080 A1 | 12/2004 | Jyumonji et al. |
| 2005/0164431 A1 | 7/2005 | Bu et al. |
| 2005/0253166 A1 | 11/2005 | Ke et al. |
| 2005/0266591 A1 | 12/2005 | Hideo |
| 2005/0272215 A1 | 12/2005 | Lee |
| 2006/0160343 A1 * | 7/2006 | Chong et al. ................. 438/593 |
| 2006/0172556 A1 | 8/2006 | Bather et al. |
| 2006/0270166 A1 * | 11/2006 | Yao et al. .................... 438/287 |
| 2006/0286758 A1 | 12/2006 | Liang et al. |
| 2007/0293056 A1 * | 12/2007 | Setsuhara et al. ........... 438/795 |

OTHER PUBLICATIONS

Wolf, S., et al., "Silicon Processing for the VLSI Era," 1986, vol. 1 - Process Technology, pp. 191-194.

Scott, G., et al., "NMOS Drive Current Reduction Caused by Transistor Layout and Trench Isolation Induced Stress," 1999, IEEE, pp. 34.4.1-34.4.4.

Ito, S., et al., "Mechanical Stress Effect of Etch-Stop Nitride and its Impact in Deep Submicron Transistor Design," 2000, IEEE, pp. 10.7.1-10.7.4.

Shimizu, A., et al., "Local Mechanical-Stress Control (LMC): A New Technique for CMOS-Performance Enhancement," 2001, IEEE, pp. 19.4.1-19.4.4.

Ootsuka, F., et al., "A Highly Dense, High-Performance 130nm node CMOS Technology for Large Scale System-on-a-Chip Applications," 2000, IEEE, pp. 23.5.1-23.5.4.

Welser, J., et al., "Strain Dependence of the Performance Enhancement in Strained-Si *n*-MOSFETs," 1994, IEEE, pp. 15.2.1-15.2.4.

Rim, K., et al., "Strained Si NMOSFETs for High Performance CMOS Technology," 2001, Symposium on VLSI Technology Digest of Technical Papers, IEEE, pp. 59-60.

\* cited by examiner

SUPER ANNEAL FOR PROCESS INDUCED STRAIN MODULATION

This application claims priority to provisional application Ser. No. 60/691,422, filed Jun. 17, 2005, and entitled "Super Anneal for Process Induced Strain Modulation," which application is incorporated herein by reference.

TECHNICAL FIELD

This invention relates generally to metal-oxide-semiconductor (MOS) devices, and more particularly to MOS devices with strained channel regions and processes for forming the same.

BACKGROUND

The scaling of VLSI circuits is a constant effort. With circuits becoming smaller and faster, improvement in device driving current is becoming more important. Device current is closely related to gate length, gate capacitance, and carrier mobility. Shortening poly-gate length, increasing gate capacitance, and increasing carrier mobility can improve the device current performance. Gate length reduction to shrink circuit size is an on-going effort. Increasing gate capacitance has also been achieved by efforts such as reducing the gate dielectric thickness, increasing the gate dielectric constant, and the like. In order to further improve device current, enhancing carrier mobility has also been explored.

Among efforts made to enhance carrier mobility, forming a strained silicon channel is a known practice. Strain, sometimes referred to as stress, can enhance bulk electron and hole mobility. The performance of a MOS device can be enhanced through a strained-surface channel. This technique allows performance to be improved at a constant gate length, without adding complexity to circuit fabrication or design.

When silicon is placed under strain, the in-plane, room temperature electron mobility is dramatically increased. One way to develop strain is by using a graded SiGe epitaxy layer as a substrate on which a layer of relaxed SiGe is formed. A layer of silicon is formed on the relaxed SiGe layer. MOS devices are then formed on the silicon layer, which has inherent strain. Since the lattice constant of SiGe is larger than that of Si, the Si film is under biaxial tension and thus the carriers exhibit strain-enhanced mobility.

Strain in a device may have components in three directions, parallel to the MOS device channel length, parallel to the device channel width, and perpendicular to the channel plane. The strains parallel to the device channel length and width are called in-plane strains. Research has revealed that a bi-axial, in-plane tensile strain field can improve nMOS performance, and compressive strain parallel to channel length direction can improve pMOS device performance.

Strain can also be applied by forming a strained capping layer, such as a contact etch stop (CES) layer, on a MOS device. When a strained capping layer is deposited, due to the lattice spacing mismatch between the capping layer and underlying layer, an in-plane stress develops to match the lattice spacing. FIG. 1 illustrates a conventional MOS device having a strained channel region. Strained capping layers, such as spacers 9 and CES layer 14, introduce a strain in source/drain regions 12 (including LDD regions 15), and a strain is generated in channel region 11. Therefore, the carrier mobility in the channel region 11 is improved.

The conventional method of forming strained capping layers suffers drawbacks, and the effect is limited by the properties of the capping layer. For example, the thickness of the strained capping layer is limited due to the subsequent gap filling difficulty caused by the thick capping layer. Therefore, the strain applied by the capping layer is limited. In addition, forming a strained capping layer that has customized strains for different devices, such as pMOS and nMOS devices, is particularly complex and costly. The process-induced strain significantly influences the transistor device performance. Many local mechanical stress-controlling techniques have been proposed to enhance the carrier mobility for better device performance. For example, highly strained silicon nitride layers have been used as contact etch stop layers or spacers to introduce strong strain in channel regions of transistors. All these methods will have limitations due to properties of the strained layer. It is difficult to deposit a high quality layer with high strain.

What is needed, then, is a method to improve a capping layer's ability to impose a strain to the channel region of the MOS device without adding more complexity into the manufacturing processes.

SUMMARY OF THE INVENTION

The preferred embodiments of the present invention provide a semiconductor structure having different strains in different device regions and a method to modulate strains.

In accordance with one aspect of the present invention, the method includes providing a substrate having a first device region on the substrate, forming a stressor layer overlying the substrate, exposing the substrate to a high-energy source and annealing the stressor layer, so that the stressor layer is super annealed for a short duration, preferably less than about 1 second.

In accordance with another aspect of the present invention, the substrate further includes a second device region, and the method further includes masking the second device region while the first device region is annealed. The second device region may or may not be annealed by an additional super anneal. The first and second super anneals have different energy levels and/or different wavelengths, so that the portions of the stressor layer in the first and second device regions have different strains.

The step of forming the stressor layer may comprise a step to form a gate spacer, a step to form a capping layer, preferably a contact etch stop layer, a step to form an inter-layer dielectric layer, and combinations thereof. The super anneal can be performed on each of the gate spacer, the contact etch stop layer, and the inter-layer dielectric layer, or performed after two or three layers are formed.

In accordance with yet another aspect of the present invention, the semiconductor structure includes a substrate having a first device region and a second device region, and at least one stressor layer overlying the first and second device regions. The stressor layer comprises the gate spacer, contact etch stop layer, inter-layer dielectric layer, and combinations thereof. The stressor layer has a first portion having a first strain in the first device region and a second portion having a second strain in the second device region. The second strain is preferably substantially different from the first strain. At least one of the first and second strains are modulated by a super anneal process with an anneal duration of less than about one second.

In accordance with yet another aspect of the present invention, the first device region includes an nMOS device and the second device region includes a PMOS device. For improved performance on both devices, the first strain is substantially tensile and the second strain is substantially compressive.

In accordance with yet another aspect of the present invention, a super anneal can be performed on an entire wafer or locally on specific regions, such as different types of devices or circuits. Asymmetric spacers or CESL structures between different types of devices, circuits or systems can be formed in accordance with the present invention.

By using the preferred embodiments of the present invention, different strains can be generated in different device regions, and strains of the stressor layer can be modulated with less complexity.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for modulating strains after the formation of a stressor layer is illustrated in FIGS. 2 through 10. Throughout the various views and illustrative embodiments of the present invention, like reference numbers are used to designate like elements.

Figure 1:
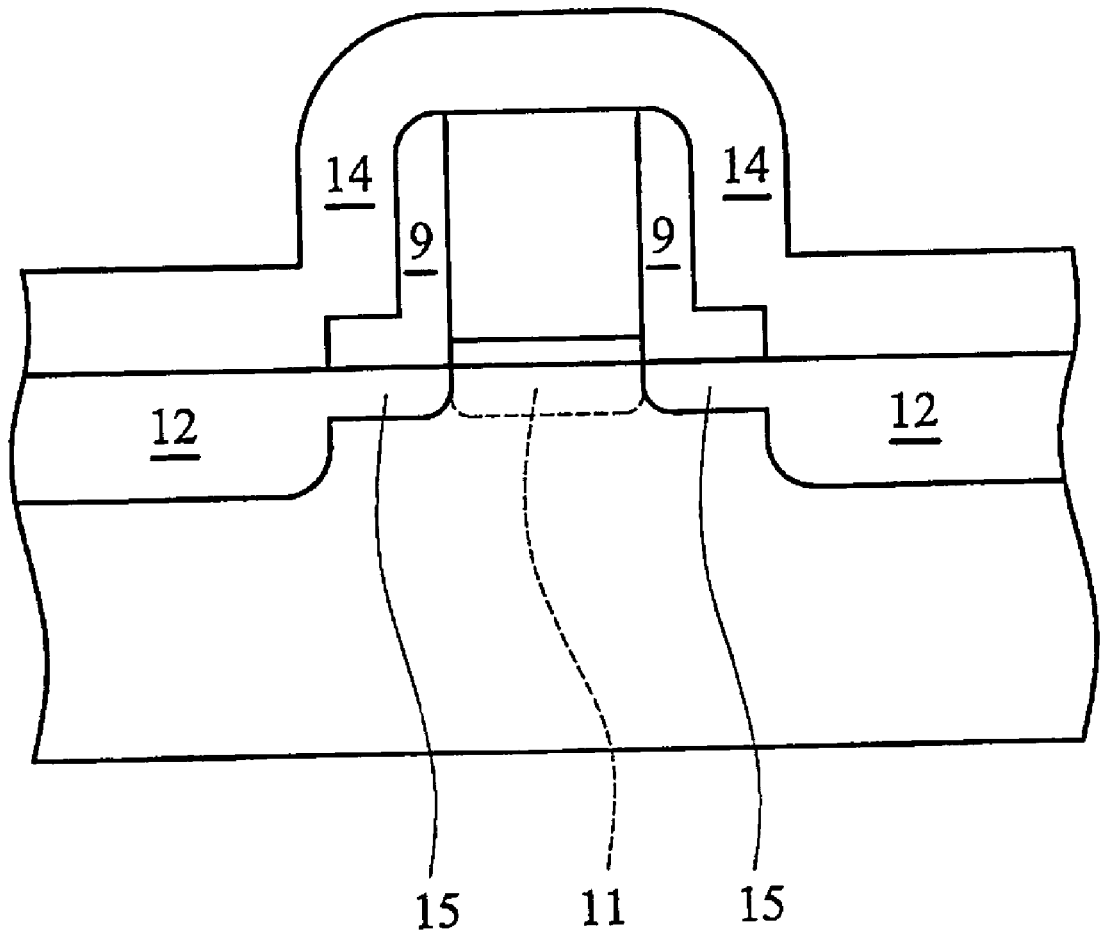
FIG. 1 illustrates a conventional MOS device having a strained channel region, wherein a contact etch stop layer applies a strain.
Figure 2:
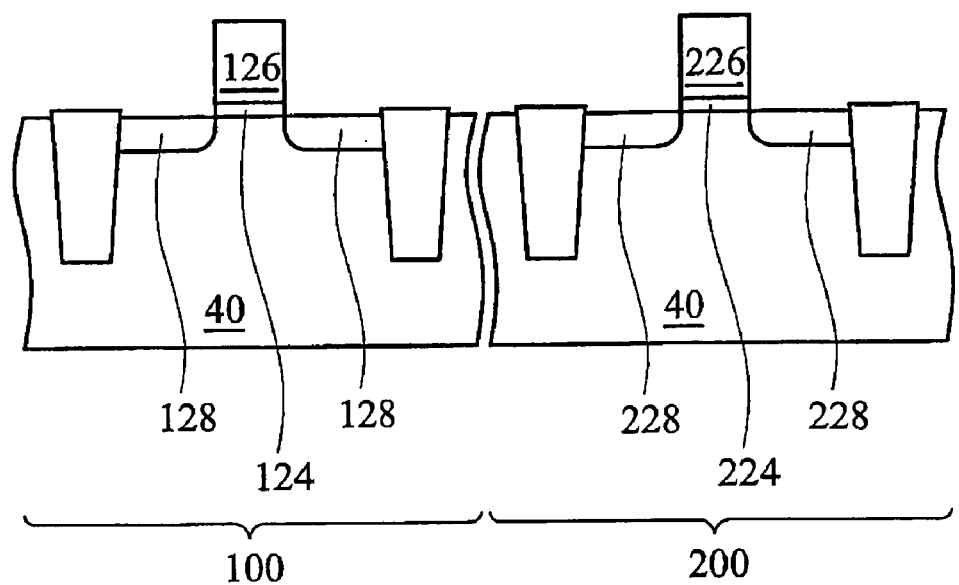
FIGS. 2 through 10 are cross-sectional views of intermediate stages in the manufacture of a MOS transistor embodiment.

Referring to FIG. 2, a substrate 40 is provided. The substrate 40 can be formed of common substrate materials such as silicon, SiGe, strained silicon on SiGe, silicon on insulator (SOI), silicon germanium on insulator (SGOI), germanium on insulator (GOI), and the like. The substrate 40 preferably includes device regions 100 and 200, which are used for forming different logic devices. In one embodiment, one of the regions 100 and 200 is used for a pMOS transistor, and the other is for an NMOS transistor. In other embodiments, one of the regions 100 and 200 is a core region comprising a core device, and the other is a peripheral region comprising an I/O device. In yet another embodiment, one of the regions 100 and 200 is a logic region comprising a logic circuit, and the other region is a memory region comprising a memory cell, for example, a static random access memory (SRAM) cell or a dynamic random access memory (DRAM) cell.

A first gate structure is formed in the first device region 100, comprising a gate dielectric 124 and a gate electrode 126. A second gate structure is formed in the second device region 200, comprising a gate dielectric 224 and a gate electrode 226. As is well known in the art, in order to form the gate structures, a gate dielectric layer is formed on the substrate 40. The gate dielectric layer preferably has a high K value. A gate electrode layer, preferably comprising polysilicon, metals or metal silicides, is formed on the gate dielectric layer. The gate dielectric layer and gate electrode layer are then patterned to form the gate dielectrics 124 and 224, and the gate electrodes 126 and 226, respectively. Lightly doped drain/source (LDD) regions 128 and 228 are then formed in regions 100 and 200, respectively, preferably by implanting appropriate impurities.

Figure 3:
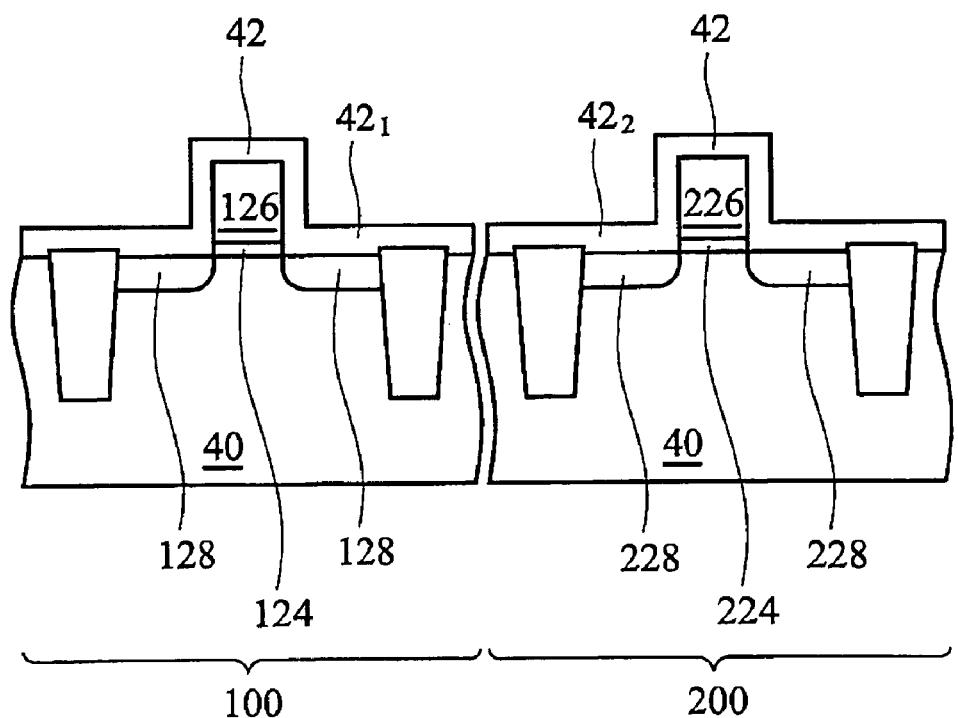

FIG. 3 illustrates a spacer layer 42 blanket deposited on the previously formed structure. Throughout the description, the spacer layer 42 is sometimes referred to as a stressor layer. The stressor layer, however, may include other layers, such as subsequently formed contact etch stop layers and inter-layer dielectric layers, and any super annealing process described for one of the stressor layers is equally applicable to other stressor layers.

In the preferred embodiment, the spacer layer 42 comprises a single layer that covers both the regions 100 and 200, and the portions in the regions 100 and 200 are denoted as $42_1$, and $42_2$, respectively. The spacer layer 42 preferably comprises SiN, oxynitride, oxide, and the like, and is preferably formed by commonly used methods such as plasma enhanced chemical vapor deposition (PECVD), low pressure chemical vapor deposition (LPCVD), rapid thermal chemical vapor deposition (RTCVD), atomic layer deposition (ALD), physical vapor deposition (PVD), and the like. As is known in the art, the strain of the spacer layer 42 can be adjusted by choosing an appropriate material and method of formation, and adjusting process parameters, such as temperature, deposition rate, power, etc. One skilled in the art can find the relationship between the strains in a film and the respective forming parameters through experiments. After the deposition, the spacer layer 42 has a first inherent strain.

Figure 4:
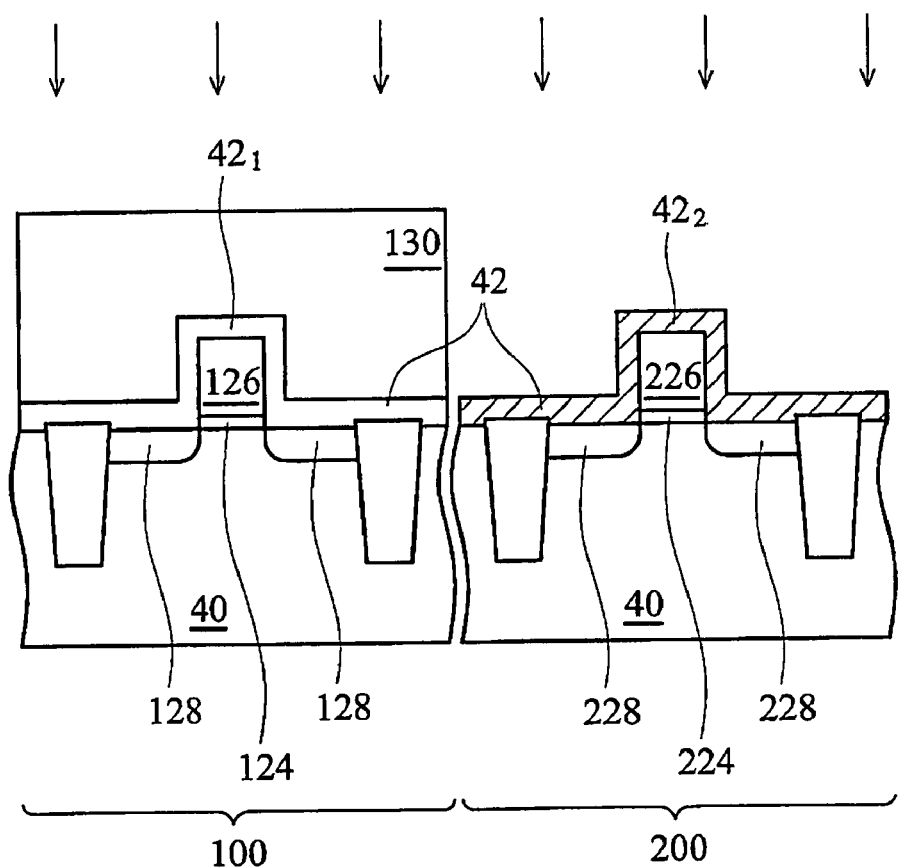

A masking layer 130 is formed to cover the region 100, as shown in FIG. 4. In the preferred embodiment, the masking layer 130 is preferably a photo resist layer. In alternative embodiments, the masking layer 130 comprises a layer(s) such as a photo resist, an anti-reflect-coating (ARC), a hard mask, and combinations thereof.

A super anneal is then performed to anneal the spacer layer 42, preferably by exposing the substrate 40 to a high-energy radiance source, such as a laser or a flash lamp for a short duration. The masking layer 130 absorbs (and/or reflects) the energy of the radiance source and protects the underlying spacer layer $42_1$, from being annealed. The exposed spacer portion $42_2$ is annealed due to the rapid increase of its temperature. Preferably, the wavelength of the high-energy radiance source is between about 1 nm and about 1 mm. By adjusting the wavelength, the substrate can be annealed to a desired depth. The longer the wavelength is, the greater the annealing depth will be. The anneal duration for a super annealing process is preferably less than about one second. In one embodiment, the preferred anneal duration is between about one pico-second to about one milli-second. The anneal temperature is preferably higher than about 1000° C., which can be achieved by adjusting the energy level of the high-energy radiance source. In alternative embodiments, the super anneal includes a flash anneal. The masking layer 130 is removed after the super anneal.

The strain in the spacer layer portion $42_2$ is modulated by the super anneal. Typically, the strain value in a film tends to change toward the tensile side after being super annealed. For example, if a compressive strain is represented by a negative value, and a tensile strain value is represented by a positive value, the strain value increases after super annealing. Experiments have revealed that a correlation exists between the increase of the strain value and the energy of the super anneal, wherein the higher the energy is, the greater the increase is. Therefore, it is possible to adjust the strain values in the stressor layer by subjecting the devices to different energy levels.

After the super anneal, the spacer layer $42_2$ has a second inherent strain. Since the masked portion $42_1$ has maintained the first inherent strain, the subsequently formed spacers in regions 100 and 200 will have different strains, thus applying different strains to the respective MOS devices. For example, the spacer layer $42_1$ may have a compressive strain. Due to the super anneal, the spacer layer $42_2$ has a tensile strain. In another example, the spacer layer $42_1$ can has a tensile strain, and the spacer layer $42_2$ can have a tensile strain with a greater value.

FIG. 4 shows that only a portion of the stressor layer (such as the spacer layer portion $42_2$) is annealed. This is an advantageous feature, as strains of some of the devices on a chip, such as nMOS or pMOS devices, can be separately adjusted without affecting others. The preferred embodiments of the present invention, therefore, provide a flexible way of modulating strains.

Optionally, the spacer portion $42_1$ can be further annealed when region 200 is masked (not shown). However, the parameters of the super anneals, such as energies and/or wavelengths, are preferably different, so that spacer layer portions $42_1$ and $42_2$ have different strains.

The density of the spacer layer 42, from which gate spacers are ultimately formed, is increased by the super anneal. Typically, after the spacer formation and before the source/drain region formation, wet dip processes, such as cleaning processes, are performed. As a side effect, the spacers are etched. This causes problems in the control of the thickness of the spacers, particularly when the etching rate of the spacer is high. The increase of the spacer layer density reduces the impact of the subsequent wet dip process, so that the spacer controllability is improved. Additionally, since the super anneal is performed in a very short period of time, although the LDD regions 128 and 228 are likely to be annealed along with the spacer layer 42, the diffusion of impurities in the LDD regions 128 and 228 is well controlled.

In alternative embodiments, the masking layer 130 is not formed. The regions 100 and/or 200 can be selectively super annealed by applying radiance energy to some of the device regions on a chip, such as by the use of a tightly focused radiance beam, for example, a laser beam with tunable beam spot size and shape.

Figure 5:
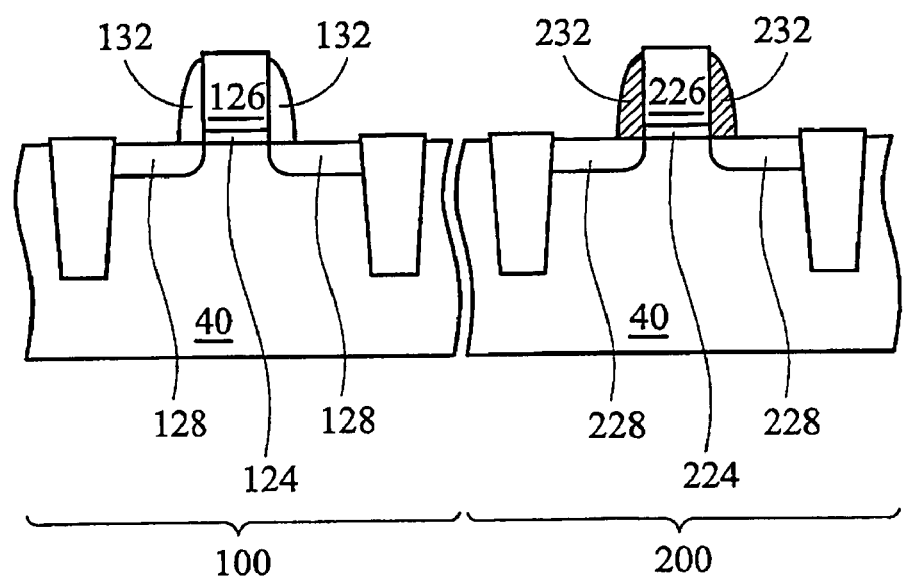

FIG. 5 illustrates the formation of the spacers 132 and 232, preferably by anisotropically etching, and more preferably by reactive ion etching (RIE) and removing the spacer layer 42 from the horizontal surfaces. In the resulting structure, the spacers 132 and 232 have different inherent strains, thus applying different strains to the channel regions of the respective MOS devices.

Figure 6:
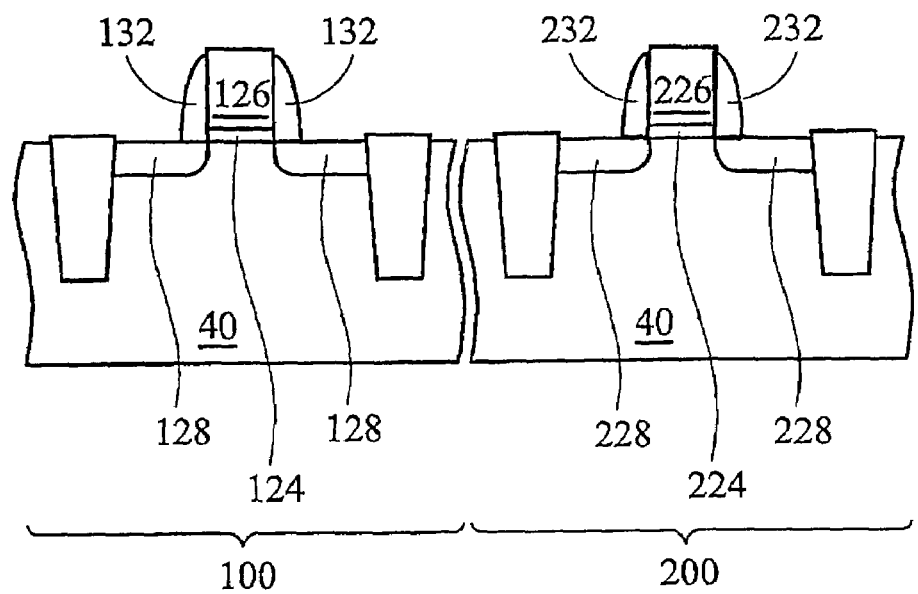
Figure 7:
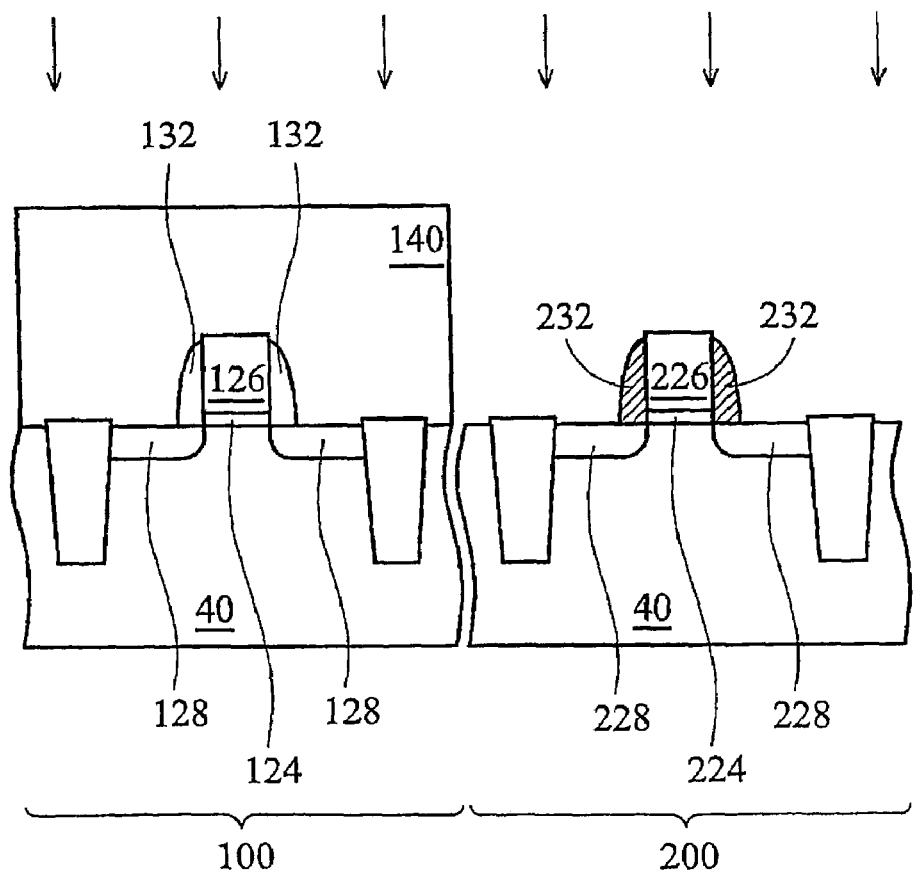

The similar structure shown in FIG. 5 can also be formed using different processes, as shown in FIGS. 6 and 7. FIG. 6 illustrates an intermediate step after the structure shown in FIG. 3 is formed. The spacer layer 42 is etched before the super anneal is performed, so that spacers 132 and 232 have the same strains. Referring to FIG. 7, a masking layer 140, which is preferably similar to the masking layer 130 (see FIG. 4), is formed to protect the spacers 132, and a super anneal is then performed to anneal the spacers 232. The masking layer 140 is then removed.

Figure 8:
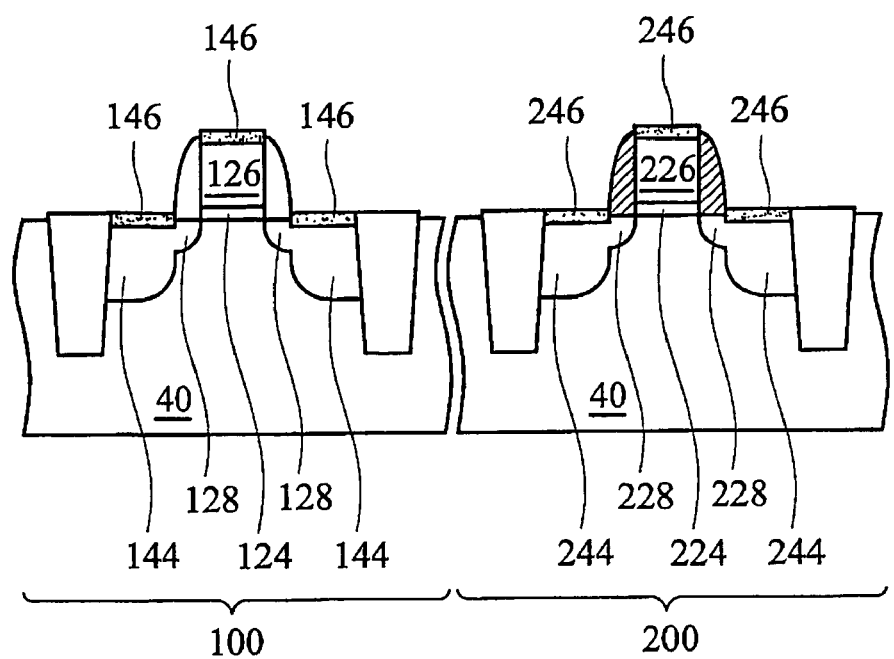

FIG. 8 illustrates the formation of the source/drain regions 144, 244, and silicide regions 146, 246. The source/drain regions 144 and 244 may be recessed in or elevated above the substrate 40 (using, e.g., epitaxially grown regions), in which case the subsequently formed strain-inducing layer will also be recessed or elevated. In the preferred embodiment, the source/drain regions 144 and 244 are formed by implanting impurities into the semiconductor substrate 40. The respective spacers 132 and 232 are used as masks so that the edges of the source and drain regions 144 and 244 are substantially aligned with the respective spacers. Gate electrodes 126 and 226 are preferably implanted to reduce sheet resistance.

Silicide regions 146 and 246 may be formed by salicide processes on the respective source/drain regions 144 and 244. To form a silicide layer, a metal layer is preferably formed by first depositing a thin layer of metal, such as cobalt, nickel, titanium, or the like, over the device. The device is then annealed to form a silicide between the deposited metal and the underlying exposed silicon regions. Un-reacted metal is removed.

Figure 9:
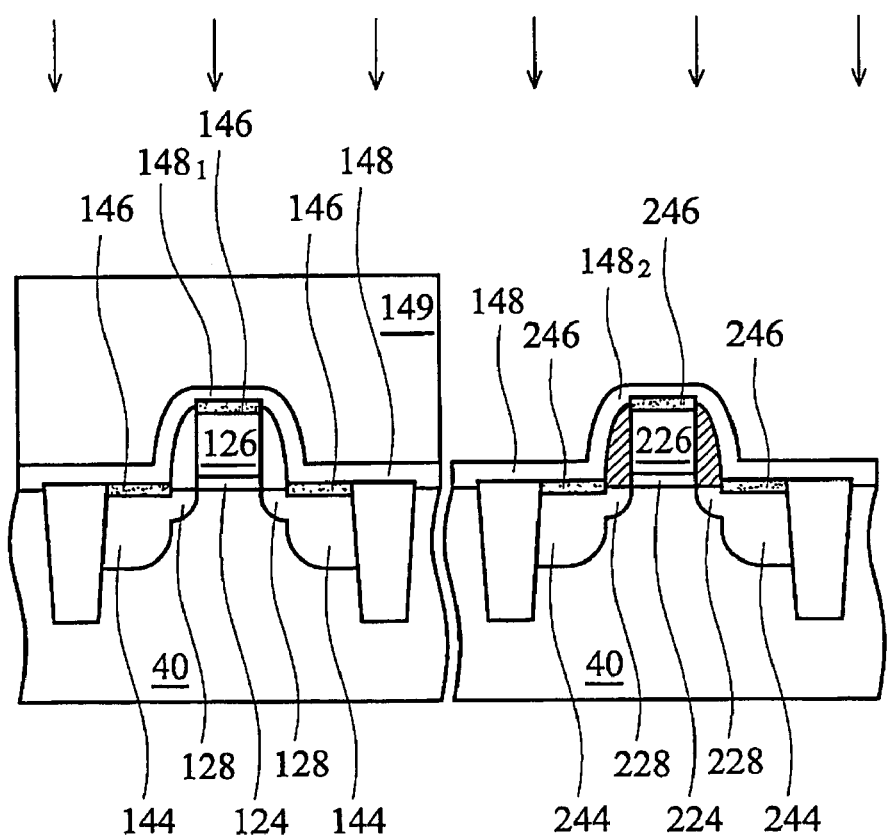

FIG. 9 illustrates a structure after the formation of a contact etch stop layer (CESL) 148, which comprises portions $148_1$ and $148_2$. Preferably, the CESL 148 comprises SiN, oxynitride, oxide, and the like. In the preferred embodiment, the CESL 148 is blanket deposited using a material that provides a desirable strain to the channel region of the MOS device in region 100. The CESL $148_2$ in region 200 is then super annealed with the help of a masking layer 149, so that the appropriate strain is generated in the CESL portion $148_2$. In alternative embodiments, CESL portion $148_1$ is annealed while CESL portion $148_2$ is masked. In yet other embodiments, CESL portions $148_1$ and $148_2$ are annealed in separate super anneal processes with different energy levels and/or wavelengths. After the super anneal, the masking layer 149 is removed.

Figure 10:
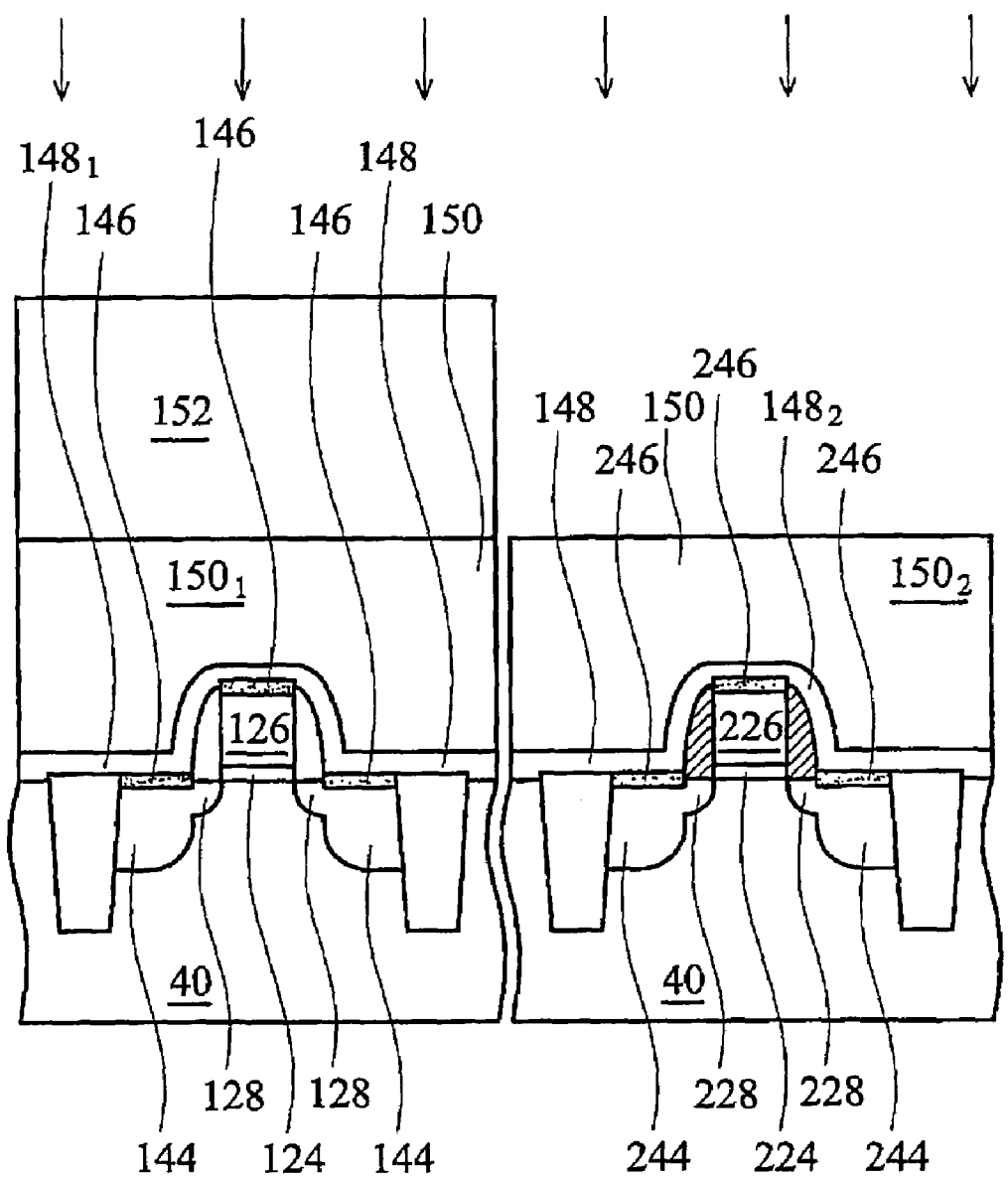

Next, as shown in FIG. 10, an inter-layer dielectric (ILD) layer 150, which comprises portions $150_1$ and $150_2$, is deposited over the surface of the CESL 148. A masking layer 152 is formed to cover region 100. A super anneal is performed. Through the super anneal, the strain in the ILD portion $150_2$ is modulated.

In the previously discussed embodiments, the stressor layers, which include spacers 232, CESL 148 and ILD 150, are super annealed in separate processes. However, the super anneal can be performed after each of the spacers 232, CESL 148 and ILD 150 are formed, or performed after two or three of the stressor layers are formed. Hybrid strained spacer/CESL/ILD structures can be formed in different device regions by applying compressive stressor layers and super annealing to change the strain of the stressor layers in some device regions to tensile strains. For example, an nMOS device is formed in region 100, and a pMOS device is formed in region 200. The stressor layers, such as CESL $148_2$ and/or ILD $150_2$, in region 200 have a compressive strain, so that the respective channel region of the pMOS device has a compressive strain. The stressor layers in region 100 are modulated by a super anneal(s), and a tensile strain is generated. As a result, the channel region of the NMOS device has a tensile strain.

The super anneal can be performed on an entire wafer or on specific regions of the wafer, such as different type of devices, such as transistors including nMOS devices, pMOS devices, bipolar complementary MOS (Bi-CMOS) devices, bipolar transistors (BJT), capacitors, and the like. The super anneal can also be performed on different circuits, such as logic circuits, high performance circuits, low power circuits, static random access memory (SRAM), embedded-RAM, BJT, Bi-CMOS, radio frequency (RF) circuits, mix-mode circuits, etc.

The preferred embodiments of the present invention have several advantageous features. The strains in the spacers, the CES layer and the ILD of a MOS device are modulated, so that the strain in the channel region is improved. The density of the spacer is also improved. By separately super annealing the respective stressors of different devices, different strains, which are desired by the respective devices, are generated. The drawbacks of the low temperature formation of the spacers are therefore overcome.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
   providing a substrate comprising a first device region and a second device region;
   forming a stressor layer over the substrate; and
   exposing the substrate to a high-energy radiance source and annealing the stressor layer in the first device region for less than about 1 second, wherein the stressor layer in the second device region is not annealed.

2. The method of claim 1 wherein the annealing step has a duration of between about one pico-second and about one milli-second.

3. The method of claim 1 wherein the second device region is a periphery region or a memory cell region.

4. The method of claim 1 further comprising annealing the stressor layer in the second device region substantially differently from the annealing of the stressor layer in the first device region.

5. The method of claim 1 wherein the stressor layer comprises a layer selected from the group consisting essentially of a spacer, a capping layer, an inter-layer dielectric layer, and combinations thereof.

6. The method of claim 1 wherein the first device region is a logic device region.

7. A method for forming a semiconductor transistor, the method comprising:
   providing a substrate having an active region;
   forming a first gate electrode over the active region;
   forming a second gate electrode over the active region;
   forming a stressor layer having a first portion overlying the first gate electrode and a second portion overlying the second gate electrode; and
   exposing the substrate to a high-energy radiance source and performing a first annealing process to anneal the first portion of the stressor layer for a duration of less than about 1 second, wherein the second portion of the stressor layer is not annealed by the first annealing process.

8. The method of claim 7 wherein the duration is between about one pico-second and about one milli-second.

9. The method of claim 7 wherein the high-energy radiance source comprises a source selected from the group consisting essentially of a laser and a flash lamp.

10. The method of claim 7 wherein the high-energy radiance source has a wavelength of between about 1 nm and about 1 mm.

11. The method of claim 7 wherein during the first annealing process, the first portion of the stressor layer is subjected to a temperature of higher than about 1000° C.

12. The method of claim 7 wherein the step of forming the stressor layer comprises:
   forming a gate spacer layer; and
   patterning and etching the gate spacer layer to form a gate spacer before the first annealing process.

13. The method of claim 7 wherein the step of forming the stressor layer comprises:
   forming a gate spacer layer; and
   patterning and etching the gate spacer layer to form a gate spacer after the first annealing process.

14. The method of claim 7 wherein the second portion of the stressor layer is annealed by a second annealing process different from the first annealing process, and wherein the second annealing process is performed by exposing the substrate to an additional high-energy radiance source and annealing for a duration of less than about 1 second.

15. The method of claim 7, wherein the step of forming the stressor layer comprises:
   forming a gate spacer layer over the first and the second gate electrodes; and
   patterning the gate spacer layer to form the first portion of the stressor layer comprising a first gate spacer on a sidewall of the first gate electrode, and the second portion of the stressor layer comprising a second gate spacer on a sidewall of the second gate electrode.

16. The method of claim 15 wherein the first annealing process is performed between the steps of forming and patterning the gate spacer layer.

17. The method of claim 16 further comprising forming a mask layer to cover the second portion of the stressor layer before the first annealing process, and removing the mask layer after the first annealing process, wherein the first portion of the stressor layer is exposed through the mask layer during the first annealing process.

18. The method of claim 15 further comprising forming a contact etch stop layer over the first gate electrode and the first gate spacer, wherein the first annealing process is performed after the step of patterning the gate spacer layer and before the step of forming the contact etch stop layer.

* * * * *